United States Patent [19]

Shimizu

[11] 3,999,208
[45] Dec. 21, 1976

[54] CHARGE TRANSFER SEMICONDUCTOR DEVICE

[75] Inventor: Shinji Shimizu, Choufu, Japan

[73] Assignee: Hitachi, Ltd., Japan

[22] Filed: July 14, 1975

[21] Appl. No.: 595,437

Related U.S. Application Data

[63] Continuation of Ser. No. 404,894, Oct. 10, 1973, abandoned.

[30] Foreign Application Priority Data

Oct. 18, 1972  Japan ............................ 47-103577

[52] U.S. Cl. ............................. 357/24; 307/221 C; 307/304
[51] Int. Cl.² ........................................ H01L 29/78
[58] Field of Search .......... 357/24; 307/221 C, 304

[56] References Cited

UNITED STATES PATENTS

| | | |
|---|---|---|
| 3,676,715 | 7/1972 | Brojdo ................................. 357/24 |
| 3,796,932 | 3/1974 | Amelio et al. ....................... 357/24 |
| 3,829,884 | 8/1974 | Borel et al. .......................... 357/24 |

OTHER PUBLICATIONS

S. Shimizu et al., "Charge–Coupled Device with Buried Channels Under Electrode Gaps", Appl. Phys. Letters, vol. 22, No. 6, Mar. 15, 1973, pp. 286–287.

*Primary Examiner*—Michael J. Lynch
*Assistant Examiner*—Joseph E. Clawson, Jr.
*Attorney, Agent, or Firm*—Craig & Antonelli

[57] ABSTRACT

A charge transfer semiconductor device includes charge transfer passages which are formed in the interior of a semiconductor substrate and between adjacent gate electrodes, so that when a control voltage is applied to the gate electrode, charges to be transferred are moved principally through the charge transfer passage, whereby the charges are prevented from being trapped between the gate electrodes.

11 Claims, 13 Drawing Figures

FIG. 1
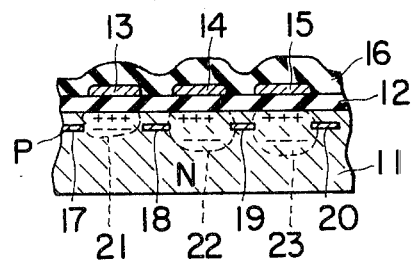
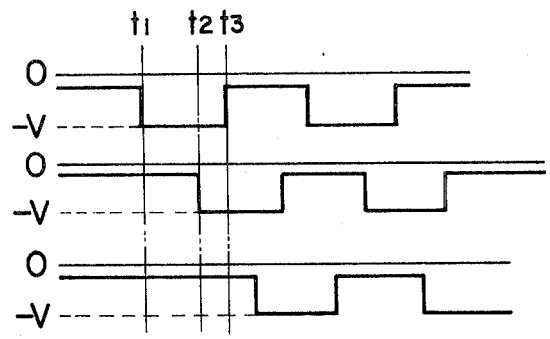
FIG. 2a
FIG. 2b
FIG. 2c
FIG. 3a
FIG. 3b
FIG. 3c
FIG. 3d
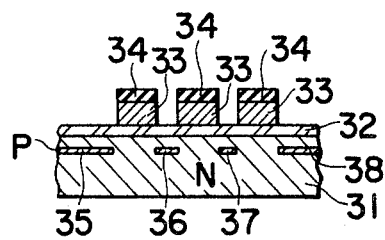
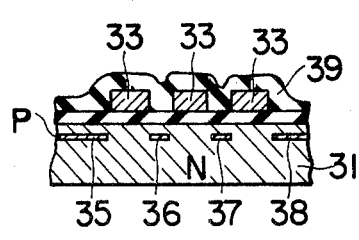

CHARGE TRANSFER SEMICONDUCTOR DEVICE

This is a continuation of application Ser. No. 404,894 filed Oct. 10, 1973 now abandoned.

BACKGROUND OF THE INVENTION

1. Field of the Invention

The present invention relates to charge transfer semiconductor devices and, more particularly, to a charge coupled semiconductor device (CCD).

2. Description of the Prior Art

Unlike prior-art semiconductor devices of the construction in which P-N junctions are formed within a semiconductor, the charge coupled semiconductor device uses as an information transmitting medium, charges existing in the vicinity of the surface of a semiconductor substrate, and controls the transfer of the charges by a voltage applied to a gate electrode. It has various features such as a small number of manufacturing steps and a good yield, and recently has acquired considerable attention in the art.

The semiconductor device, however, merely employs the charges present in the vicinity of the surface of the substrate as the information transmitting medium, and successively transfers them. It effects substantially no amplifying operation. Furthermore, the charges (carriers) being transferred move along the surface of the substrate, so that they are sometimes trapped halfway between the transfer electrodes to lower the transfer efficiency. It has hitherto been of importance to increase the transfer efficiency. A variety of proposals have, therefore, been made, any of which, however, provides an improvement merely by changing the working bias conditions, not by modifying the construction of the device itself. Although the characteristic under the gate electrodes can be improved to some extent, no attention has been paid to the trap phenomenon in the area between the gate electrodes which cannot be externally and directly controlled by the bias.

SUMMARY OF THE INVENTION

It is, therefore, a principal object of the present invention to provide an improved charge transfer semiconductor device.

Another object of the present invention is to provide a charge transfer semiconductor device which can diminish the number of peripheral circuits.

Still another object of the present invention is to provide a charge transfer semiconductor device which can enlarge the interval of gate electrodes.

In order to accomplish such objects, and with notice taken of the fact that the transfer of charges is effected in the surface of a semiconductor substrate in the prior-art devices, the present invention provides a charge transfer passage in the interior of a semiconductor substrate and between adjacent gate electrodes, to thereby prevent the trap phenomenon in the portion between the gate electrodes.

BRIEF DESCRIPTION OF THE DRAWINGS

FIG. 1 is a constructional view showing an embodiment of the charge transfer semiconductor device according to the present invention;

FIGS. 2a-2c are wave-form diagrams for explaining the operation of the embodiment in FIG. 1; and FIGS. 3 to 5 are process diagrams illustrating examples of the method of manufacturing the charge transfer semiconductor device according to the present invention.

PREFERRED EMBODIMENTS OF THE INVENTION

Figure 4A:
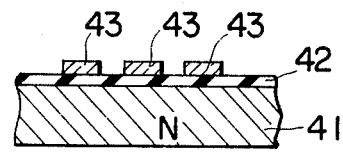

FIG. 1 shows an embodiment of the charge transfer semiconductor device according to the present invention. In the figure, a thin gate insulating film 12 of, for example, an oxide ($SiO_2$) film is disposed on an N-type semiconductor substrate 11. Further, on the insulating film 12, gate electrodes 13, 14 and 15 made of polycrystalline silicon are arranged at suitable intervals. The gate electrodes 13–15 and that part of the insulating film 12 which is not covered with the gate electrodes are covered with an oxide film 16. Within the semiconductor substrate 11, there are formed P-type impurity regions 17–20 which constitute the transfer passages of carriers between the respectively adjacent gate electrodes.

The operation of the embodiment will now be described. It is assumed that the gate electrodes 13–15 are sequentially applied with a low voltage as shown in FIGS. 2a, 2b and 2c, respectively.

When the negative voltage $-V$ is first applied to the gate electrode 13 at a time $t_1$, a depletion layer 21 of a certain depth is formed in the vicinity of the surface of the semiconductor substrate 11 located under the gate electrode 13. When, under this condition, positive charges are injected into the semiconductor substrate 11 adjacent the gate electrode 13 (by means not shown), they are passed through the region 17 and are accumulated in the depletion layer 21.

When the negative voltage $-V$ is subsequently applied to the gate electrode 14 at a time $t_2$, a depletion layer 22 is formed, as in the foregoing case, in the vicinity of the surface of the semiconductor substrate 11 positioned under the gate electrode 14.

In this state, the interior of the depletion layer 22 has a lower potential than the interior of the depletion layer 21 in which the charges are accumulated. Therefore, some of the positive charges flow from the interior of the depletion layer 21 through the P-type region 18 to the interior of the depletion layer 22. Thus, the interior of the depletion layer 21 and that of the depletion layer 22 become equal in potential.

When the application of the negative voltage $-V$ to the gate electrode 13 subsequently terminates at a time $t_3$, the potential of the interior of the depletion layer 21 becomes higher than that of the interior of the depletion layer 22. Consequently, the charges in the depletion layer 21 flow through the region 18 into the depletion layer 22, which is at a lower potential, and are accumulated therein.

A similar operation is carried out between the gate electrodes 14 and 15. That is, as is apparent from the above explanation, when positive charges, having a carrier function, move from the depletion layer 21 to depletion layer 22 or from depletion layer 22 to depletion layer 23, they are successively transferred via the conductor region 18 or 19. For this reason, the positive charges having the carrier function are not transferred along the surface of the semiconductor substrate 11 as they are in the prior art, but they are transferred through the P-type impurity regions 17–20 within the bulk. Accordingly, the trap phenomenon arising between the gate electrodes in the prior art is prevented.

The foregoing operation will now be explained with respect to information transfer. It is assumed, by way of example, that when the voltage is applied to the gate electrode 13, the charges are injected at the part adjacent the gate electrode 13 by suitable means, to thus record a bit of information 1. At this time, with the prior-art construction, the information bit 1 is attenuated on account of the trap phenomenon. In contrast, if the transfer passages are provided as explained above, the charge transfer is carried out by the transfer passages, and hence, the trap phenomenon does not directly affect the information. The attenuation of the information bit 1 can, accordingly, be prevented. When the part changes the recording from the information bit 1 to an information bit 0, it never occurs that charges having been trapped until then are released to make the discrimination between the information 0 and 1 impossible.

FIGS. 3a to 3d illustrate an example of the method of producing the charge transfer semiconductor device according to the present invention. Referring to the figures, a gate oxide film 32 which is 1,000 Å thick is first formed as shown in FIG. 3a on an N-type semiconductor substrate 31 having a specific resistance of 10–20 $\Omega$ cm. Further, a polycrystalline silicon layer 33 of approximately 0.3–0.7 $\mu$ thickness is formed.

After diffusing boron into the polycrystalline silicon layer 33, photoresist layer 34 is formed on the polycrystalline silicon layer 33 in conformity with a predetermined pattern. Thereafter, the polycrystalline silicon layer 33 is photoetched into a construction as shown in FIG. 3b. Under these conditions, boron is buried in the semiconductor substrate 11 by an ion implantation process. Thus, as shown in FIG. 3c, P-type impurity regions 35–38, being transfer passages, are formed at a boron concentration of $10^{17}$–$10^{18}$/cm$^3$ at positions approximately 0.5–1$\mu$ below the surface of the semiconductor substrate.

After removing the photoresist 34, an oxide film 39 is formed as shown in FIG. 3d on the resultant substrate by the use of the CVD (chemical vapor deposition) process.

Although, in this example, the gate electrodes are formed by subjecting the polycrystalline silicon to boron diffusion, other impurities (including those of the N type) may also be employed. As an example, a self-alignment type semiconductor device having the same construction as the semiconductor device in FIG. 1 can be produced.

Figure 4B:
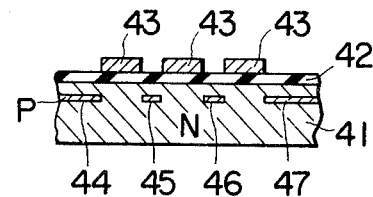

FIGS. 4a and 4b illustrate another example of the method of manufacturing the charge transfer semiconductor device according to the present invention, especially the semiconductor device of the non-self-alignment type. As shown in FIG. 4a, a gate oxide film 42 is first formed on a semiconductor substrate 41. Further, an Al (aluminum) layer is deposited on the oxide film 42. Photoresist is formed on the Al layer in accordance with a predetermined pattern. Using the photoresist as a mask, the aluminum is partially etched to form electrodes 43. Boron is then ion-implanted, so that P-type impurity regions 44–47 are formed within the semiconductor substrate 41, as shown in FIG. 4b.

In this way, the impurity regions 44–47 constituting the transfer passages can be formed in a manner similar to the embodiment of FIG. 3.

Figure 5A:
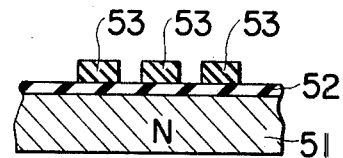
Figure 5B:
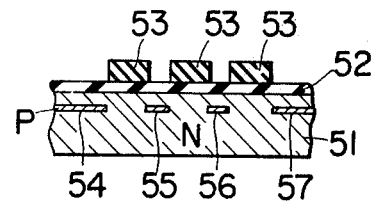
Figure 5C:
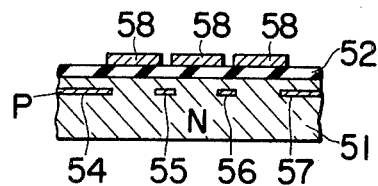

FIGS. 5a to 5c illustrate still another example of the method of manufacturing the charge transfer semiconductor according to the present invention, especially a semiconductor device of the non-self-alignment type. As shown in FIG. 5a, a gate oxide film 52 is formed on a semiconductor substrate 51. Further, a photoresist 53 is arranged on the oxide film 52 in conformity with a predetermined pattern. Boron is then ion-implanted, so that P-type impurity regions 54–57 are formed within the semiconductor substrate 51, as shown in FIG. 5b.

Thereafter, the photoresist portions 53 are removed. Aluminum gate electrodes 58 are formed on the oxide film 52 in accordance with a predetermined pattern.

In this manner, the impurity regions 54–57 constituting the transfer passages can also be formed.

In the foregoing embodiment, when a negative voltage is applied to each gate electrode, the depletion layers in the vicinity of the adjacent gate electrodes are coupled, resulting in the perfect conduction between both the depletion layers. In order to prevent such coupling, a high-concentration impurity region of the same conductivity type as that of the substrate may be formed in the semiconductor substrate surface between the gate electrodes. For example, when the semiconductor substrate is of the N-type, phosphorus is ion-implanted. In this case, the concentration distribution exhibits a peak at, for example, the surface of the semiconductor substrate, and the value is, for example, $10^{17}$–$10^{18}$/cm$^3$.

It allows the distance between the adjacent gate electrodes to be large so that, as in the present invention, the transfer passages for charges are provided within the semiconductor substrate and between the mutually adjacent gate electrodes.

In more detail, the transfer passage can be considered as being a mere conductor, and the other region of the semiconductor substrate between the gate electrodes does not directly contribute to the charge transfer. In other words, the spread of the depletion layer need only extend from the surface of the semiconductor substrate to the transfer passage. It is not related to the distance between the gate electrodes. Accordingly, the spacing between the adjacent gate electrodes can be made large. When the spacing between the adjacent gate electrodes is made larger than the sum of the spreading depths of the adjacent depletion layers, it is possible to cause only the transfer passages to contribute to the charge transfer, and to suppress fluctuations in the quantity of transfer charges which are attributable to the trap phenomenon arising in the surface of the semiconductor substrate. Besides, since the distance between the gate electrodes is enlarged with this measure, manufacture of the semiconductor device is facilitated.

As stated above, in accordance with the charge transfer semiconductor device of the present invention, charges are not transferred in the surface of the semiconductor substrate, but they are transferred through impurity regions within the bulk. As a result, the trap phenomenon at the area between the gate electrodes, which arises in dependence on the state of the semiconductor substrate surface in the prior art, is prevented, and the transfer efficiency can be increased.

In accordance with the present invention, the number of bits which can be continuously formed can be increased, and the number of peripheral circuits such as signal regenerators can be decreased even in an LSI. In accordance with the present invention, the transfer line between the gate electrodes can be considered as a mere conductor, so that its length can be made comparatively large.

The short-circuit between the adjacent depletion layers can be prevented in such way that the high-concentration impurity region of the same conductivity type as that of the substrate is formed in the semiconductor substrate surface between the gate electrodes.

It is possible to cause only the transfer passages to contribute to the charge transfer, in such way that the distance between the adjacent gate electrodes is made larger than the spreading depths of the adjacent depletion layers at the charge transfer.

What I claim is:

1. A charge transfer semiconductor device comprising:
   a semiconductor substrate of a first conductivity type;
   a first layer of insulating material disposed on the surface of said substrate;
   a plurality of gate electrode layers disposed on the surface of said first layer of insulating material; and
   a plurality of charge transfer passages buried within said substrate, so as to be isolated from each other and completely spaced from the surface thereof by the substrate, between respective portions thereof beneath said gate electrodes for effecting the transfer of charge carriers between the portions of said substrate beneath said electrodes in response to the application of control voltages to said gate electrodes.

2. A charge transfer semiconductor device, according to claim 1, wherein said charge transfer passages are formed of respective semiconductor regions of a second conductivity type opposite said first conductivity type and of a relatively high impurity concentration.

3. A charge transfer semiconductor device, according to claim 1, wherein the distance between respective ones of said electrodes is greater than the spreading depths of adjacent depletion layers formed during the transfer of charges within said substrate.

4. A charge transfer semiconductor device, according to claim 2, wherein the distance between respective ones of said electrodes is greater than the spreading depths of adjacent depletion layers formed during the transfer of charges within said substrate.

5. A charge transfer semiconductor device, according to claim 2, wherein said electrodes are formed of polycrystalline silicon material, said semiconductor regions having an impurity concentration of about $10^{17}$–$10^{18}$ cm$^{-3}$ disposed in said substrate to a depth of about 0.5 to 1$\mu$.

6. A charge transfer semiconductor device according to claim 2, further including a high-concentration impurity region of said first conductivity type formed in the surface of said substrate between said gate electrodes.

7. A charge transfer semiconductor device comprising:
   a semiconductor substrate of a first conductivity type;
   a first layer of insulating material disposed on the surface of said substrate;
   a plurality of gate electrode layers disposed on the surface of said first layer of insulating material; and
   a plurality of semiconductor regions of a second conductivity type, opposite said first conductivity type, buried in said substrate, so as to be completely spaced from the surface thereof by the substrate, beneath the respective surface portions of the substrate between the gate electrodes, for effecting the transfer of charge carriers between the portions of the substrate beneath said gate electrodes.

8. A charge transfer semiconductor device according to claim 7, wherein the distance between respective ones of said electrodes is greater than the spreading depths of adjacent depletion layers formed during the transfer of charges within said substrate.

9. A charge transfer semiconductor device according to claim 7, further including a high-concentration impurity region of said first conductivity type formed in the surface of said substrate between said gate electrodes.

10. A charge transfer semiconductor device comprising:
    an N-type semiconductor substrate;
    a first layer of insulating material disposed on a surface of said substrate;
    a plurality of gate electrode layers disposed on the surface of said first layer of insulating material; and
    a plurality of P-type semiconductor regions disposed in said substrate beneath said surface thereof so as to be spaced apart from each other and completely spaced apart from the surface of the substrate by the N-type semiconductor material of the substrate, each of said P-type semiconductor regions being disposed beneath a surface portion of said substrate between adjacent ones of said gate electrode layers, for effecting the transfer of charge carriers therethrough between the portions of the substrate beneath the gate electrodes.

11. A charge transfer semiconductor device according to claim 10, wherein the distance between respective ones of said electrodes is greater than the spreading depths of adjacent depletion layers formed during the transfer of charges within said substrate.

* * * * *